United States Patent
Kuo et al.

(10) Patent No.: US 9,761,486 B2
(45) Date of Patent: Sep. 12, 2017

(54) METHOD OF CHIP PACKAGING

(71) Applicant: TAIWAN SEMICONDUCTOR MANUFACTURING COMPANY, LTD., Hsinchu (TW)

(72) Inventors: Gwo-Chyuan Kuo, Hsinchu (TW); Han-Wei Yang, Hsinchu (TW); Chen-Chung Lai, Guanxi Township (TW)

(73) Assignee: TAIWAN SEMICONDUCTOR MANUFACTURING COMPANY, LTD. (TW)

( * ) Notice: Subject to any disclaimer, the term of this patent is extended or adjusted under 35 U.S.C. 154(b) by 0 days.

(21) Appl. No.: 14/231,123

(22) Filed: Mar. 31, 2014

(65) Prior Publication Data
US 2015/0279769 A1 Oct. 1, 2015

(51) Int. Cl.
| | |
|---|---|
| *H01L 21/768* | (2006.01) |
| *H01L 23/498* | (2006.01) |
| *H01L 21/48* | (2006.01) |
| *H01L 23/15* | (2006.01) |
| *H01L 23/48* | (2006.01) |
| *H01L 21/311* | (2006.01) |
| *H01L 21/321* | (2006.01) |

(52) U.S. Cl.
CPC .. *H01L 21/76877* (2013.01); *H01L 21/31144* (2013.01); *H01L 21/3212* (2013.01); *H01L 21/481* (2013.01); *H01L 21/7684* (2013.01); *H01L 21/76805* (2013.01); *H01L 21/76816* (2013.01); *H01L 23/15* (2013.01); *H01L 23/481* (2013.01); *H01L 23/498* (2013.01); *H01L 23/49822* (2013.01); *H01L 2924/0002* (2013.01)

(58) Field of Classification Search
CPC ............. H01L 23/49822; H01L 21/481; H01L 23/498; H01L 23/15; H01L 23/481; H01L 23/5226; H01L 21/31144; H01L 21/76805; H01L 21/76877
USPC .......................... 438/427, 700, 637, 675, 620
See application file for complete search history.

(56) References Cited

U.S. PATENT DOCUMENTS

| | | | | |
|---|---|---|---|---|
| 6,737,345 | B1* | 5/2004 | Lin | ...................... H01L 23/5258 257/529 |
| 2010/0184295 | A1* | 7/2010 | Sato | .................. H01L 21/76229 438/702 |
| 2011/0223734 | A1* | 9/2011 | Davis | .................. H01L 21/3065 438/296 |

(Continued)

*Primary Examiner* — Shouxiang Hu
(74) *Attorney, Agent, or Firm* — Hauptman Ham, LLP

(57) ABSTRACT

A method of forming a chip package portion having a reduced loading effect between various metal lines during a leveling process comprises forming a first layer, a passivation layer over the first layer, a second layer over the passivation layer, and a third layer over the second layer. The method also comprises forming a patterned opening having multiple depths by removing portions of the first layer, the passivation layer, the second layer, and the third layer by way of one or more removal processes that remove portions of the first layer, the passivation layer, the second layer, and the third layer in accordance with one or more patterned photoresist depositions. The method further comprises depositing a material into the patterned opening, and leveling the material deposited into the patterned opening.

20 Claims, 2 Drawing Sheets

(56) References Cited

U.S. PATENT DOCUMENTS

| | | | |
|---|---|---|---|
| 2012/0181701 A1* | 7/2012 | Chen | H01L 23/50 |
| | | | 257/774 |
| 2013/0034949 A1* | 2/2013 | Kao | H01L 21/76229 |
| | | | 438/427 |
| 2015/0132919 A1* | 5/2015 | Chang | G03F 1/00 |
| | | | 438/427 |

* cited by examiner

METHOD OF CHIP PACKAGING

BACKGROUND

Device manufacturers are challenged to deliver value and convenience to consumers by, for example, providing integrated circuits that provide quality performance. Semiconductor device reliability can be affected by introducing one or more defects during manufacture of a semiconductor device.

BRIEF DESCRIPTION OF THE DRAWINGS

One or more embodiments are illustrated by way of example, and not by limitation, in the figures of the accompanying drawings, wherein elements having the same reference numeral designations represent like elements throughout. It is emphasized that, in accordance with standard practice in the industry various features may not be drawn to scale and are used for illustration purposes only. In fact, the dimensions of the various features in the drawings may be arbitrarily increased or reduced for clarity of discussion.

DETAILED DESCRIPTION

The following disclosure provides many different embodiments, or examples, for implementing different features of the invention. Specific examples of components and arrangements are described below to simplify the present disclosure. These are examples and are not intended to be limiting.

Some semiconductor devices are manufactured by a method that involves various leveling or planarization processes such as chemical mechanical polishing processes (CMP) or other leveling or planarization processes that impart a load on a chip package portion during manufacture. The loads imparted on the chip package portion during manufacture sometimes cause defects in semiconductor devices such as over polishing resulting in oxide loss, dishing, and erosion issues that cause height differences between device elements such as metal lines. Height differences sometimes also introduce defocus and metal bridging issues in which one metal line is cupped while another metal line is relatively flat. These height differences sometimes result in disconnects between one or more metal lines and an interconnect or contact, for example, that render a semiconductor device inoperable or at least defective for a designed purpose.

Figure 1:
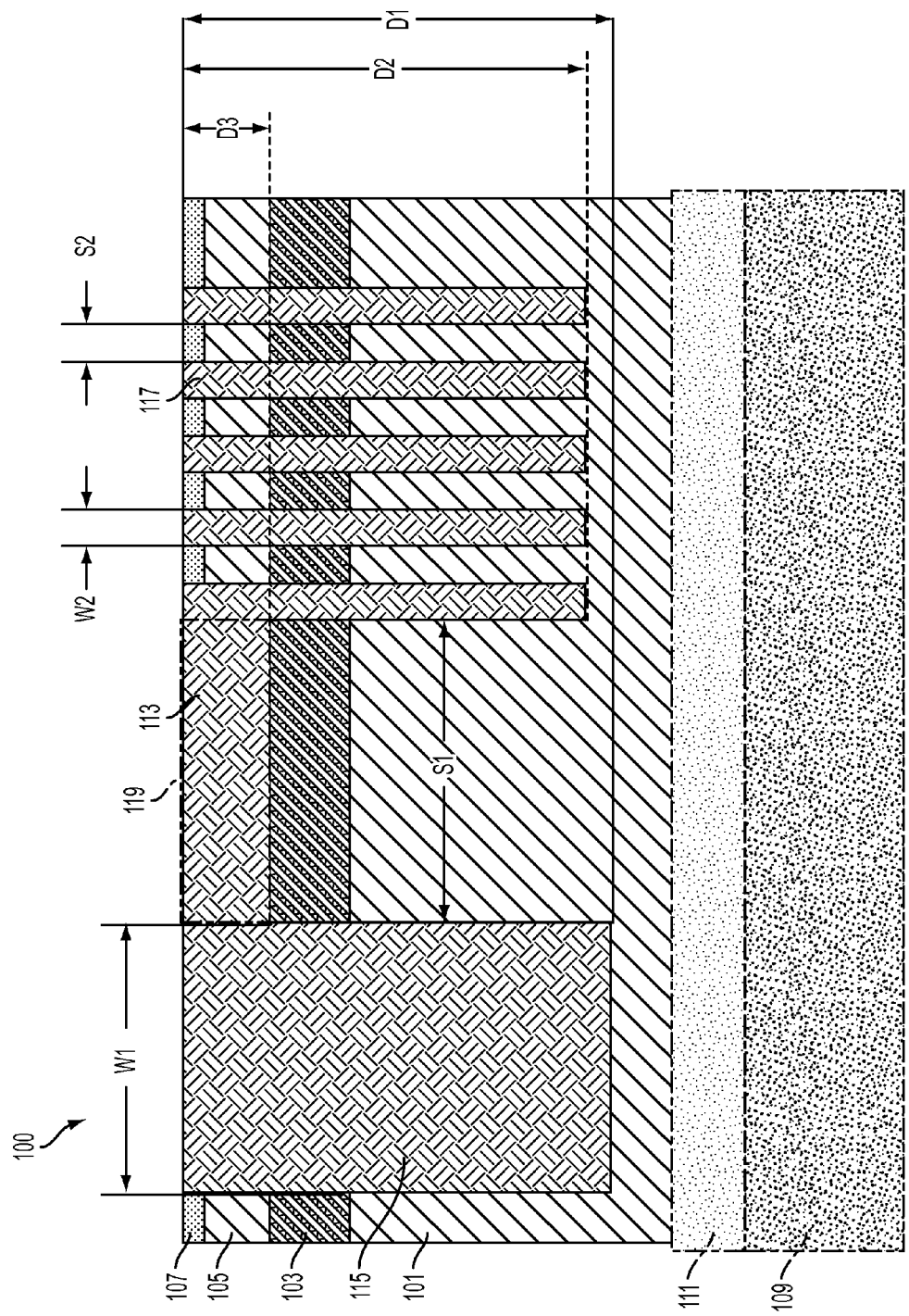
FIG. 1 is a diagram of a chip package portion configured to reduce the loading effect, e.g., caused by a leveling or planarization process, in accordance with one or more embodiments.

FIG. 1 is a diagram of a chip package portion 100 configured to reduce the loading effect, e.g., caused by a leveling or planarization process, in accordance with one or more embodiments.

The chip package portion 100 includes a first layer 101, a passivation layer 103 over the first layer 101, a second layer 105 over the passivation layer 103, and a third layer 107 over the second layer 105. In some embodiments, the chip package portion 100 optionally comprises a substrate 109 and/or one or more additional layers 111 over the substrate 109.

The chip package portion 100 further comprises a material 113 deposited into an opening formed in the first layer 101, the passivation layer 103, the second layer 105, and the third layer 107. The material 113 includes a first plug 115 having a width W1 and a depth D1. The material 113 also includes one or more second plugs 117 having a width W2. In some embodiments, the width W2 is less than the width W1. If the chip package portion 100 includes more than one second plug 117, the at least two second plugs 117 are separated from one another by a spacing S2. The one or more second plugs 117 are separated from the first plug 115 by a spacing S1. In some embodiments, the spacing S2 is less than the spacing S1. The one or more second plugs 117 have a depth D2. In some embodiments, the depth D2 is equal to the depth D1. In other embodiments, the depth D2 is less than the depth D1. In further embodiments, the depth D2 is greater than the depth D1.

The material 113 comprises a material bridge 119 coupling the first plug 115 to at least one second plug 117. The material bridge 119 has a depth D3. The depth D3 is less than the depth D1 and the depth D2. The material bridge 119 is configured to reduce the loading effect, e.g., caused by a leveling or planarization process such as a CMP process that removes some of the material 113, the second layer 105, the third layer 107, and optionally some or all of the passivation layer 103.

In some embodiments, the first layer 101 and the second layer 105 independently comprise an undoped silicate glass layer, an oxide layer, a polymer layer, or other suitable layer material. In some embodiments, the first layer 101 and the second layer 105 comprise a same material or combination of materials. In other embodiments, the first layer 101 and the second layer 105 comprise a different material or combination of materials.

In some embodiments, the passivation layer 103 comprises an oxide layer, polymer material, a modulation film, or other suitable material. In some embodiments, for example, the passivation layer 103 has a thickness that is greater than or equal to about 10 Angstroms.

In some embodiments, the third layer 107 comprises a silicon oxynitride layer, oxide layer, or other suitable layer material.

In some embodiments, the material 113 (and hence plug 115 or plug 117) is a metal comprising one or more of copper, aluminum, tin, gold, nickel, or other suitable material. In some embodiments, the substrate 109 comprises one or more of silicon, glass, a polymer, a metal, or other suitable material. In some embodiments, the one or more additional layers 111 comprise, for example, a dielectric layer, a passivation layer, silicon, an oxide, a metal, a polymer, a through via, an interconnect, or any other suitable material, layer, via or interconnect, or any combination thereof.

Figure 2:
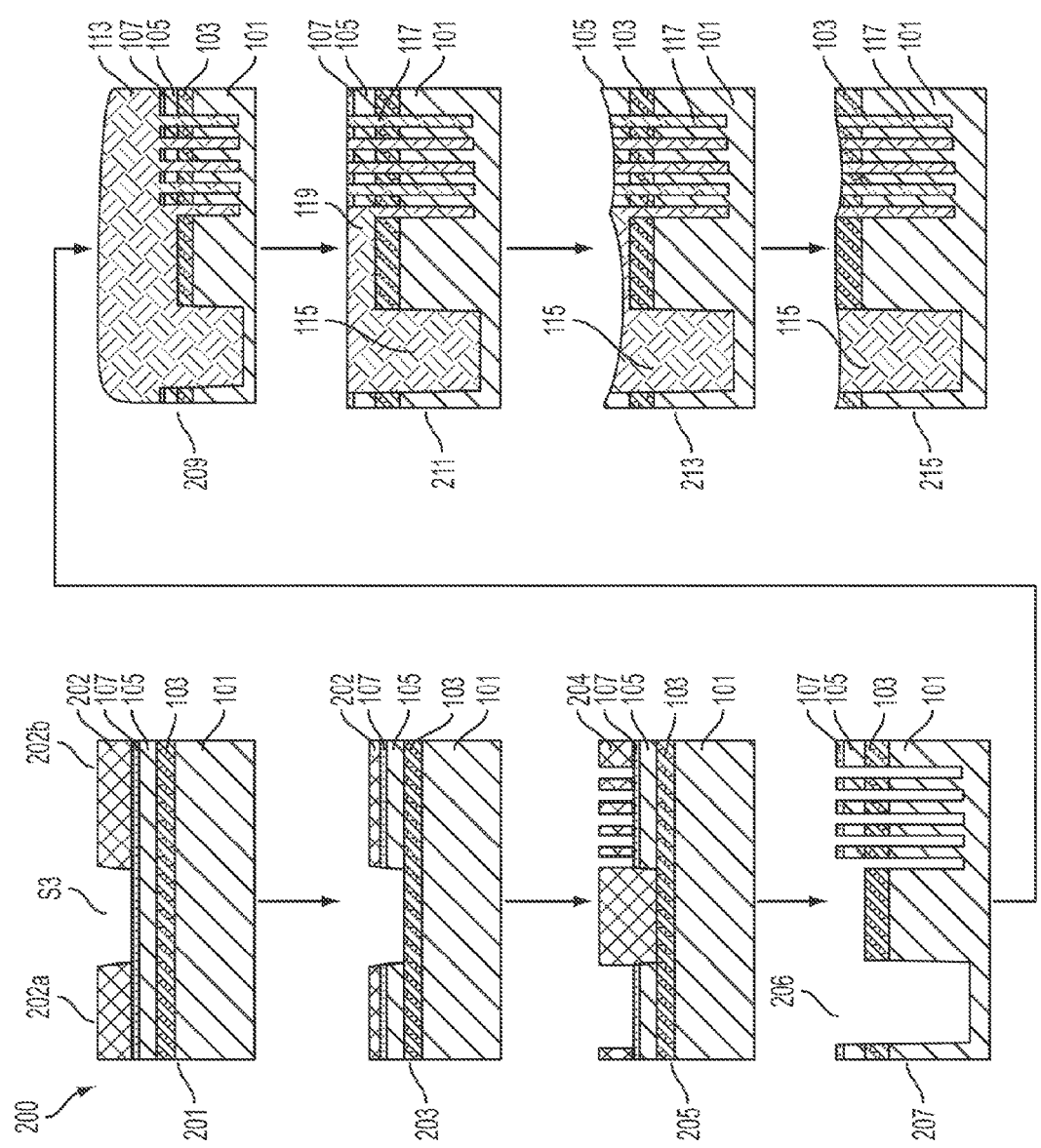
FIG. 2 is a process diagram of a method of reducing a loading effect, e.g., caused by a leveling or planarization process, in accordance with one or more embodiments

FIG. 2 is a flowchart of a method 200 of reducing a loading effect, e.g., caused by a leveling or planarization process, in accordance with one or more embodiments. Method 200 begins with step 201 in which a first patterned photoresist 202 is deposited over the third layer 107. The first patterned photoresist 202 has a first portion 202a separated from a second portion 202b by a spacing S3. A portion of the third layer 107 is left exposed through the spacing S3 between the first portion 202a and the second portion 202b.

In step 203, both the portion of the third layer 107 left exposed by the spacing S3 and a portion of the second layer 105 beneath the portion of the third layer 107 left exposed by the spacing S3 are removed to expose a portion of the passivation layer 103. In some embodiments, the photoresist 202 is entirely removed or is at least partially removed. In some embodiments, the removal is caused by, for example, an etching process or other suitable process. In some embodiments, the removal process stops at a top surface of the passivation layer 103. In other embodiments, the removal process removes some of the passivation layer 103.

In step 205, a second patterned photoresist 204 is deposited over some of the remaining third layer 107 (i.e., the third layer 107 that is not entirely removed in step 203), and at least the portion of the passivation layer 103 left exposed after removal of the first portion of the third layer 107 and the first portion of the second layer 105.

In step 207, one or more remaining portions of the third layer 107 left exposed by the second patterned photoresist 204, and one or more remaining portions of the third layer 107, one or more portions of the passivation layer 103, and one or more portions of the first layer 101 beneath the one or more remaining portions of the layer 107 left exposed by the second patterned photoresist 204 are removed to form a patterned opening 206.

In step 209 material 113 is deposited into the patterned opening 206. The patterned opening is configured to enable the material 113 deposited into the patterned opening 206 to take the form of the first plug 115 having a first depth, the second plug 117 having a second depth, and the material bridge 119 having a third depth less than the first depth and the second depth. The material bridge 119 couples the first plug 115 and at least one second plug 117.

Steps 211-215 illustrate the method 200 during stages of a leveling process. In some embodiments, steps 211-215 are performed without some or all of the remaining steps of method 200. For example, steps 211-215 make it possible to perform a method of using, e.g., chip package portion 100, as an intermediate to another useful product.

In step 211, the material 113 deposited into the patterned opening 206 is partially leveled to a point that the material bridge 119 remains between the first plug 115 and one of the second plugs 117.

In step 213, during the leveling process of the material 113 deposited into the patterned opening 206, some of the material 113 is removed, including some or all of the material bridge 119. The material bridge 119 reduces a loading effect caused during the leveling process thereby reducing, minimizing, or eliminating any potential cupping or other deformation of the metal plugs 215 and 217 caused by the leveling process.

In step 215, the leveling process is complete upon removal of the second layer 105 and the passivation layer 103 is exposed. Any cupping that occurs is limited by the material bridge 119 which improves device performance and reliability by providing a greater likelihood of success in connecting the material 113 in the first plug 115 and/or the second plug 117 to an interconnect or contact.

One aspect of this description relates to a method comprising forming a first layer, forming a passivation layer over the first layer, forming a second layer over the passivation layer, and forming a third layer over the second layer. The method also comprises depositing a first patterned photoresist over the third layer, the first patterned photoresist exposing a first portion of the third layer, removing the first portion of the third layer and a first portion of the second layer beneath the first portion of the third layer to expose a first portion of the passivation layer, depositing a second patterned photoresist over some of the remaining third layer and the first portion of the passivation layer after removal of the first portion of the third layer and the first portion of the second layer, and removing one or more remaining portions of the third layer left exposed by the second patterned photoresist, one or more remaining portions of the second layer, one or more portions of the passivation layer, and one or more portions of the first layer beneath the one or more remaining portions of the third layer left exposed by the second patterned photoresist to form a patterned opening having multiple depths. The method further comprises depositing a material into the patterned opening, and leveling the material deposited into the patterned opening.

Another aspect of this description relates to a chip package portion comprising a first layer, a passivation layer over the first layer, a second layer over the passivation layer, a third layer over the second layer, and a material deposited into a patterned opening having multiple depths within the first layer, the second layer, the passivation layer, and the third layer, the multiple depths causing the material deposited into the patterned opening to take the form of a first plug having a first depth, a second plug having a second depth, and a material bridge having a third depth less than the first depth and the second depth. The material bridge couples the first plug and the second plug.

Still another aspect of this description relates to a method comprising forming a first undoped silicate glass layer, forming a passivation layer over the first undoped silicate glass layer, forming a second undoped silicate glass layer over the passivation layer, and forming a silicon oxynitride layer over the second undoped silicate glass layer. The method also comprises depositing a first patterned photoresist over the silicon oxynitride layer, the first patterned photoresist having a first portion separated from a second portion by a spacing exposing a first portion of the silicon oxynitride layer, removing the first portion of the silicon oxynitride layer and a first portion of the second undoped silicate glass layer beneath the first portion of the silicon oxynitride layer to expose a first portion of the passivation layer, depositing a second patterned photoresist over some of the remaining silicon oxynitride layer and the first portion of the passivation layer after removal of the first portion of the silicon oxynitride layer and the first portion of the second undoped silicate glass layer, and removing one or more remaining portions of the silicon oxynitride layer left exposed by the second patterned photoresist, and one or more remaining portions of the second undoped silicate glass layer, one or more portions of the passivation layer, and one or more portions of the first undoped silicate glass layer beneath the one or more remaining portions of the silicon oxynitride layer left exposed by the second patterned photoresist forming a patterned opening. The method further comprises depositing a material into the patterned opening, and leveling the material deposited into the patterned opening.

It will be readily seen by one of ordinary skill in the art that the disclosed embodiments fulfill one or more of the advantages set forth above. After reading the foregoing specification, one of ordinary skill will be able to affect various changes, substitutions of equivalents and various other embodiments as broadly disclosed herein. Although features of various embodiments are expressed in certain combinations among the claims, it is contemplated that these features can be arranged in any combination and order. It is therefore intended that the protection granted hereon be limited only by the definition contained in the appended claims and equivalents thereof.

What is claimed is:
1. A method comprising:
forming a first layer;
forming a passivation layer over the first layer;

forming a second layer over the passivation layer;
forming a third layer over the second layer;
forming a first etch mask-exposing a first region of the third layer;
removing the third layer and the second layer below the first region to form a first opening_exposing a surface region of the passivation layer;
forming a second etch mask, the second etch mask covering the first opening and
exposing a second region of the third layer;
exposing a third region of the third layer;
removing the third layer, the second layer, the passivation layer, and a portion of the first layer below the exposed second region to form a second opening;
removing the third layer, the second layer, the passivation layer, and a portion of the first layer below the exposed third region to form a third opening, the second and third openings being on opposite sides of the first opening;
filling the first, second, and third openings with a conductive material; and
removing an upper portion of the conductive material sufficient to expose the surface region of the passivation layer.

2. The method of claim 1, wherein the first layer is an undoped silicate glass layer.

3. The method of claim 1, wherein the passivation layer is a modulation film.

4. The method of claim 1, wherein the second layer is an undoped silicate glass layer.

5. The method of claim 1, wherein the third layer is a silicon oxynitride layer.

6. The method of claim 1, wherein the material deposited into each patterned opening of the plurality of patterned openings is metal.

7. The method of claim 1, wherein the first, second, and third openings are configured to enable the material deposited into the first, second, and third openings to take the form of a first plug having a first depth, a second plug having a second depth, and a material bridge having a third depth less than the first depth and the second depth, the material bridge coupling the first plug and the second plug.

8. The method of claim 7, wherein the leveling of the material deposited into the first, second, and third openings removes the third layer, the second layer and retains some of the conductive material.

9. The method of claim 8, wherein the leveling of the material deposited into the first, second, and third openings removes the material bridge, and the material bridge reduces a loading effect caused during the leveling.

10. The method of claim 9, wherein the leveling of the material further comprises a chemical mechanical polishing process.

11. A method comprising:
forming a first undoped silicate glass layer;
forming a passivation layer over the first undoped silicate glass layer;
forming a second undoped silicate glass layer over the passivation layer;
forming a silicon oxynitride layer over the second undoped silicate glass layer;
forming a first etch mask exposing a first region of the silicon oxynitride layer;
removing the silicon oxynitride layer and the second undoped silicate glass layer below the first region to form a first opening exposing a surface region of the passivation layer;
forming a second etch mask, the second etch mask covering the first opening;
exposing a second region of the silicon oxynitride layer and exposing a third region of the silicon oxynitride layer;
removing the silicon oxynitride layer, the second undoped silicate glass layer, the passivation layer, and a portion of the first undoped silicate glass layer below the exposed second region to form a second opening;
removing the silicon oxynitride layer, the second undoped silicate glass layer, the passivation layer, and a portion of the first undoped silicate glass layer below the exposed third region to form a third opening, the second and third openings being on opposite sides of the first opening;
filling the first, second, and third openings with a conductive material; and
removing an upper portion of the conductive material sufficient to expose the surface region of the passivation layer.

12. The method of claim 11, wherein the first, second, and third openings are configured to enable the material deposited into the first, second, and third openings to take the form of a first plug having a first depth, a second plug having a second depth, and a material bridge having a third depth less than the first depth and the second depth, the material bridge coupling the first plug and the second plug.

13. The method of claim 12, wherein the removing of an upper portion of the conductive material deposited into the first, second, and third openings further comprising removing an upper portion of the surface region of the passivation layer.

14. The method of claim 11, wherein the removing of an upper portion of the conductive material comprises a chemical mechanical polishing process.

15. A method comprising:
forming a first layer;
forming a passivation layer over the first layer;
forming a second layer over the passivation layer;
forming a third layer over the passivation layer;
forming a first etch mask over the third layer, the first etch mask exposing a bridge region;
etching the third layer and the second layer in the exposed bridge region to form a bridge opening having a bridge depth and to expose a surface region of the passivation layer;
forming a second etch mask covering the bridge opening and exposing
a first plug region and a second plug region,
wherein the first plug region and the second plug region are on opposite sides of the bridge region;
etching the exposed first plug region to form a first plug opening extending into the first layer and having a first depth and the exposed second plug region to form a second plug opening extending into the first layer and having a second depth, wherein both the first and second depths are greater than the bridge depth;
depositing a conductive material layer, the conductive material filling the bridge opening, the first plug opening and the second plug opening; and
removing an upper portion of the conductive material layer to expose the surface region of the passivation layer.

16. The method of claim 15, wherein the first layer is an undoped silicate glass layer.

17. The method of claim 15, wherein the passivation layer is a modulation film.

18. The method of claim 15, wherein the second layer is an undoped silicate glass layer.

19. The method of claim 15, further comprising a third layer formed on the second layer, wherein the third layer is a silicon oxynitride layer.

20. The method of claim 15, wherein the conductive material deposited into the bridge opening, the first plug opening, and the second plug opening is metal.

* * * * *